United States Patent
Ho et al.

(10) Patent No.: US 10,620,246 B2
(45) Date of Patent: Apr. 14, 2020

(54) PASSIVE MONITOR FOR INTEGRATED CIRCUIT COMPONENTS

(71) Applicant: MEDIATEK Singapore Pte. Ltd., Solaris (SG)

(72) Inventors: Chee Guan Ho, Singapore (SG); Wee-Liang Lien, Singapore (SG); Chee Hong Yong, Kuala Lumpur (MY); Geok Teng Ong, Singapore (SG); Chin-Heng Leow, Singapore (SG)

(73) Assignee: MEDIATEK Singapore Pte. Ltd., Singapore (SG)

( * ) Notice: Subject to any disclaimer, the term of this patent is extended or adjusted under 35 U.S.C. 154(b) by 176 days.

(21) Appl. No.: 15/801,531

(22) Filed: Nov. 2, 2017

(65) Prior Publication Data
US 2018/0306848 A1 Oct. 25, 2018

Related U.S. Application Data

(60) Provisional application No. 62/488,886, filed on Apr. 24, 2017.

(51) Int. Cl.
*G01R 27/00* (2006.01)
*G01R 27/26* (2006.01)
*G06M 1/27* (2006.01)

(52) U.S. Cl.
CPC .......... *G01R 27/26* (2013.01); *G06M 1/27* (2013.01)

(58) Field of Classification Search
CPC ........ G01R 27/26; G01R 27/28; G01R 27/04; G01R 27/08; G01R 31/2834; G01R 31/2837; G06M 1/27
See application file for complete search history.

(56) References Cited

U.S. PATENT DOCUMENTS 4,150,573 A * 4/1979 Iinuma ............... G01K 7/245
324/707
5,760,596 A * 6/1998 Peiffer ............... G01R 31/02
324/603

(Continued)

FOREIGN PATENT DOCUMENTS

TW 201144834 A 12/2011
TW I456224 B 10/2014

OTHER PUBLICATIONS

Rahman et al., Single-Phase Hybrid Active Power Filter Using Single Switch Parallel Active Filter and Simple Passive Filter. 2009 International Conference on Power Electronics and Drive Systems (PEDS). 2009; 40-45.

*Primary Examiner* — Thang X Le
(74) *Attorney, Agent, or Firm* — Wolf, Greenfield & Sacks, P.C.

(57) ABSTRACT

A parameter monitor and method for monitoring a parameter of a passive component on an integrated circuit. The parameter monitor includes an oscillator circuit. The parameter monitor also includes circuitry configured to measure a first time period of an oscillation of the oscillator circuit with a passive component to produce a first digital count value, to measure second time period of an oscillation of the oscillator circuit without the passive component to produce a second digital count value, and generate a code indicative of a value of or a variation in the value of the passive component using the first and second digital count values.

20 Claims, 6 Drawing Sheets

(56) References Cited

U.S. PATENT DOCUMENTS

| | | | | |
|---|---|---|---|---|
| 6,107,815 | A * | 8/2000 | Nikutta | G11C 29/48 324/762.02 |
| 6,307,363 | B1 * | 10/2001 | Anderson | G01R 1/06772 324/149 |
| 2012/0150459 | A1 * | 6/2012 | Kim | G01R 31/2812 702/58 |
| 2013/0169265 | A1 * | 7/2013 | Tamura | G01R 25/00 324/76.77 |

* cited by examiner

PASSIVE MONITOR FOR INTEGRATED CIRCUIT COMPONENTS

CROSS-REFERENCE TO RELATED APPLICATIONS

This application claims priority to U.S. provisional application Ser. No. 62/488,886 filed Apr. 24, 2017 titled "On-chip Passives (Resistor) Monitor and Auto-calibration method" which is hereby incorporated by reference in its entirety.

BACKGROUND

1. Technical Field

The techniques described herein relate generally to monitoring values of passive integrated circuit elements.

2. Discussion of the Related Art

Parameter monitors are used in integrated circuits as a way to monitor the process variation in passive circuit elements. Parameter monitors are designed to monitor fundamental process parameters to ensure the accuracy of their values.

SUMMARY

Some embodiments relate to a parameter monitor for monitoring a parameter of a passive component on an integrated circuit. The parameter monitor includes an oscillator circuit. The parameter monitor also includes at least one counter configured to measure a first time period of an oscillation of the oscillator circuit with the passive component to produce a first digital count value and to measure a second time period of an oscillation of the oscillator circuit without the passive component to produce a second digital count value. The parameter monitor also includes a code generation circuit configured generate a code indicative of a value of or a variation in the value of the passive component using the first and second digital count values.

Some embodiments relate to a parameter monitor for monitoring a parameter of a passive component on an integrated circuit. The parameter monitor includes an oscillator circuit. The parameter monitor also includes circuitry configured to measure a first time period of an oscillation of the oscillator circuit with a passive component to produce a first digital count value, to measure second time period of an oscillation of the oscillator circuit without the passive component to produce a second digital count value, and to generate a code indicative of a value of or a variation in the value of the passive component using the first and second digital count values.

Some embodiments relate to a method of monitoring a parameter of a passive component on an integrated circuit. The method includes measuring a first time period of an oscillation of an oscillator circuit with a passive component to produce a first digital count value, measuring second time period of an oscillation of the oscillator circuit without the passive component to produce a second digital count value, and generating a code indicative of a value of or a variation in the value of the passive component using the first and second digital count values.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

In many modern circuit systems there has been a trend towards aggressive process scaling and miniaturization. As semiconductor processes rely on increasingly smaller fabrication nodes, significant process variation becomes impactful in numerous ways. Integrated passive circuit elements, such as resistors, capacitors, and inductors, have increasingly large error in their values relative to the desired design values as fabrication nodes are reduced in size. The increase in error may lead manufacturers to accept higher yield loss to maintain performance, quality assurance engineers to spend more time and money calibrating and testing passive components, and/or designers to over-engineer designs to be tolerant of the wider range of values.

Error in passive component values may cascade and reduce the accuracy of an entire system. For example, some systems utilize a reference voltage throughout a system based on scaling of a bandgap voltage. If the resistors used to scale the bandgap voltage and obtain the reference voltage have inaccurate values, the reference voltage may be incorrect and the accuracy or operation of the system may be degraded. In another example, some systems generate a reference current using a resistor that has a reference voltage across it. The reference current through the resistor is the reference voltage divided by the resistance of the resistor. If the resistor has an inaccurate value, then the reference current may have an inaccurate value and the accuracy or operation of the system may be degraded.

To overcome these issues, some systems use accurate external passive components and comparators to overcome the inaccuracy of passive components. However, prior solutions may lead to the use of expensive external components and additional testing time. Some systems use a bandgap voltage reference, which may lead to the implementation of additional analog to digital converts that use additional space and incur cost. Some systems use voltage domain analysis to derive process parameters, which may lead to the use of additional components for voltage scaling and reference as well as analog-to-digital converters to generate control codes for compensation, which may use additional space and cost.

The inventors have recognized the need for an improved parameter monitor. In some embodiments, a parameter monitor may monitor a temporal parameter, such as a time constant, associated with a circuit that includes one or more passive elements. By measuring the temporal parameter, the component value of one or more passive elements in the circuit may be derived.

In some embodiments, the component value of the passive component may be adjusted based on the measurement. For example, the measured temporal parameter may be mapped to a digital code indicative of the value of a passive component or its deviation from a nominal value. Based on the digital code, the component value of the passive component may be adjusted, as discussed further below.

Figure 1:
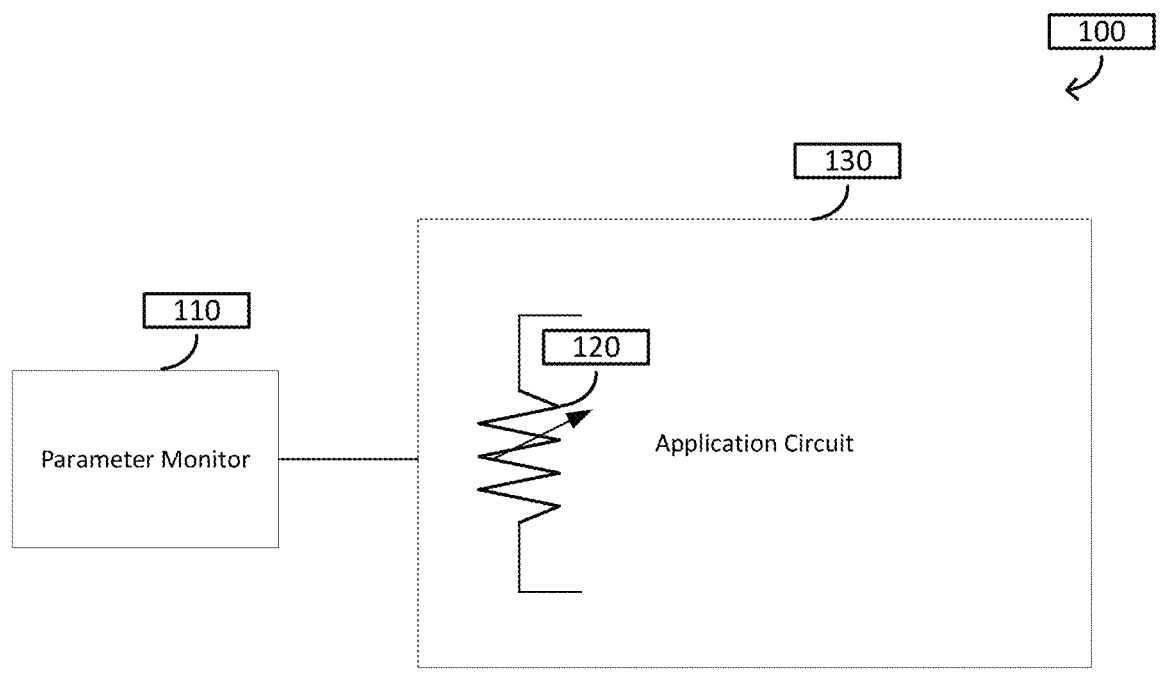
FIG. 1 shows an example of a parameter monitor connected to an integrated passive circuit element.

FIG. 1 shows an embodiment of a system 100 comprising a parameter monitor 110 and an application circuit 130. The application circuit 130 includes a circuit element 120. As described above, the application circuit 130 may be any integrated circuit susceptible to process, voltage or temperature variation, where the circuit element 120 may have a value with variation that is desired to be corrected. The circuit element 120 is shown as a resistor in FIG. 1, but may be any passive component, such as a resistor, a capacitor, or an inductor, for example. The value of circuit element 120 may be monitored by measuring a time constant or other temporal parameter of a circuit that includes the circuit element 120. The parameter monitor 110 may be a circuit system capable of monitoring a value of the circuit element 120 and generating a code to adjust the value of the circuit element 120, as will be described in greater detail below. The parameter monitor 110 may adjust the value of the circuit element 120 to overcome the effects of process, voltage or temperature variation to bring the value of the circuit element 120 closer to a desired value. The desired value may be established during manufacturing, or may change during the operation of the application circuit 130. Parameter monitor 110 is shown as being external to the application circuit 130, but it should be appreciated that the parameter monitor 110 may be a part of the application circuit 130.

Figure 2A:
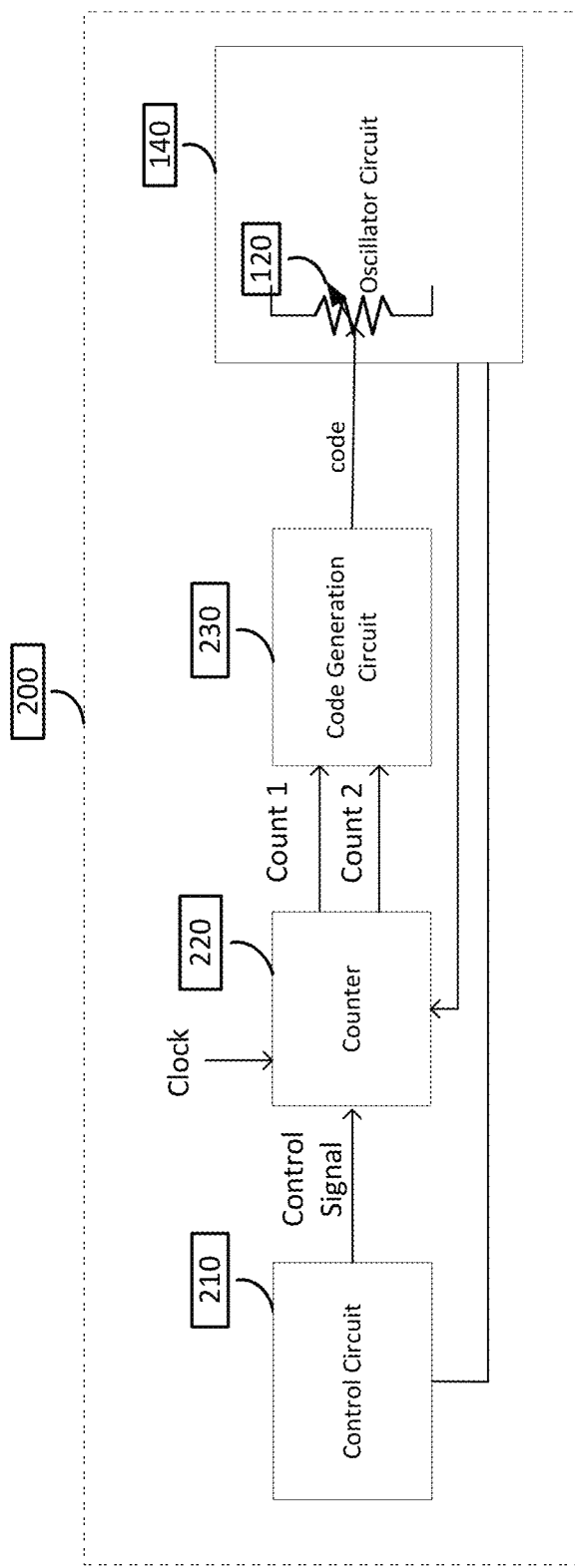
FIG. 2A shows an embodiment of a parameter monitor.

FIG. 2A shows an embodiment of a parameter monitor 200. The parameter monitor 200 may be configured to monitor and adjust the value of the circuit element 120. While circuit element 120 is shown as a resistor, it should be appreciated that any passive component or combination of passive components may be monitored and/or adjusted. The parameter monitor 200 may comprise a control circuit 210, a counter 220, and a code generation circuit 230. Control circuit 210 may include any suitable circuitry, such as a logic circuit, a controller, etc. The control circuit 210 may control the oscillator circuit 140 to form an oscillator that includes circuit element 120 and an oscillator that does not include circuit element 120. Oscillator circuit 140 may be on the same integrated circuit as the other components of the parameter monitor. Control circuit 210 controls the counter 220 to measure a temporal parameter of the oscillator circuit 140. For example, the counter 220 may measure the period, or the half-period of the oscillations, or another suitable time period characteristic of the oscillations. The counter 220 receives a clock signal Clock and counts the number of pulses of the clock signal during a time period of an oscillation. The clock signal Clock may be derived from a component on the integrated circuit, such as an on-chip oscillator, or from an external component, such as a crystal clock. The counter 220 may determine two count values. Count 1 represents the timing of the oscillator including circuit parameter 120. Count 2 represents the timing of the oscillator that does not include the circuit parameter 120. For example, Count 1 and Count 2 may be digital codes representing the number of clock cycles in a period or half period of the oscillation, or another suitable period characteristic of the oscillation. Count 1 and Count 2 may be provided simultaneously or sequentially. The code generation circuit 230 receives Count 1 and Count 2 and determines a code representative of the component value of circuit element 120. For example, code generation circuit 230 may include circuitry configured to subtract Count 2 from Count 1 to determine the code. The difference between Count 1 and Count 2 represents the difference in the period of the oscillations with and without circuit element 120 in the circuit. Since the period of the oscillations depends on the value of the passive components in the oscillator, the code is indicative of the value of circuit element 120. The code may be used to adjust the value of circuit element 120 closer to its desired value. For example, circuit element 120 may be a variable resistor that has its resistance set based upon the received code. As an example, if the parameter monitor 200 determines that the current value of the variable resistor 120 corresponds to a code 9 (i.e., having a four-bit digital code of 1001), and the desired value of the variable resistor 120 corresponds to a code 12 (i.e., having a four-bit digital code of 1100), then the variable resistor may be adjusted by an amount that corresponds to the difference.

Figure 2B:
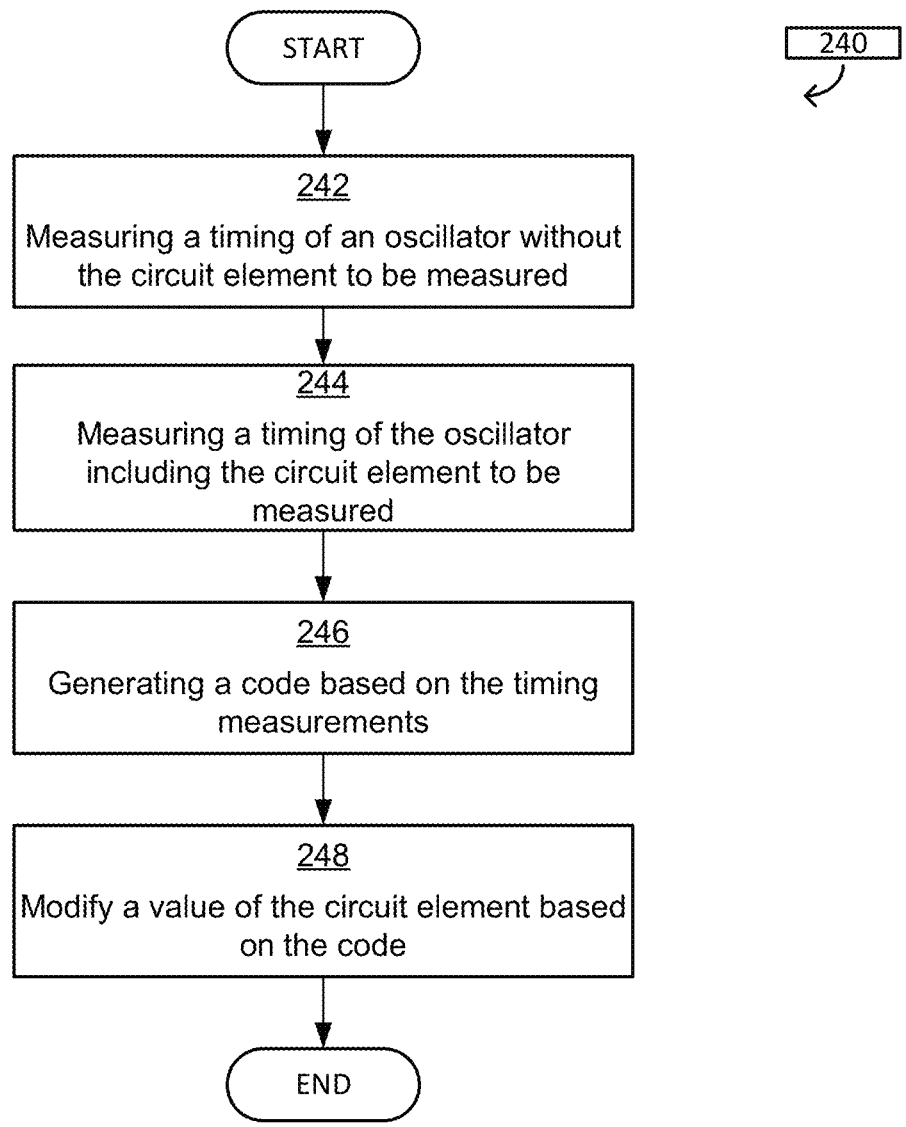
FIG. 2B shows a method of operation for a parameter monitor.

FIG. 2B illustrates a method 240 of operating a parameter monitor, according to some embodiments. The method 240 may begin with act 242, where the parameter monitor measures the timing of an oscillator that may not be connected to the circuit element. The oscillator may be any suitable oscillator described herein, and the timing may correspond to an oscillation period of the oscillator, a half-oscillation period, or any integer multiple thereof, for example. The parameter monitor may measure the timing of the oscillator by counting a number of oscillations of the oscillator signal during a time period, for example. In act 244, the parameter monitor may measure a timing of an oscillator that may be connected to the circuit element. The oscillator may be the same oscillator as the one in act 242 if the circuit element is switchably connected to the oscillator, or a separate oscillator connected to the circuit element may be used. The parameter monitor may measure the timing of the oscillator by counting a number of oscillations of the oscillator signal during a time period, for example. In act 246, the parameter monitor may generate a code based on the two timing measurements. The code may correspond to a difference between the two measurements. As such, the code may correspond to a value for the circuit element. In act 248, the value of the circuit element may be modified based on of the code. For example, the code may be compared to a code indicating the desired value of the circuit element, and the resultant comparison may be used to adjust the value of the circuit element.

Figure 3:
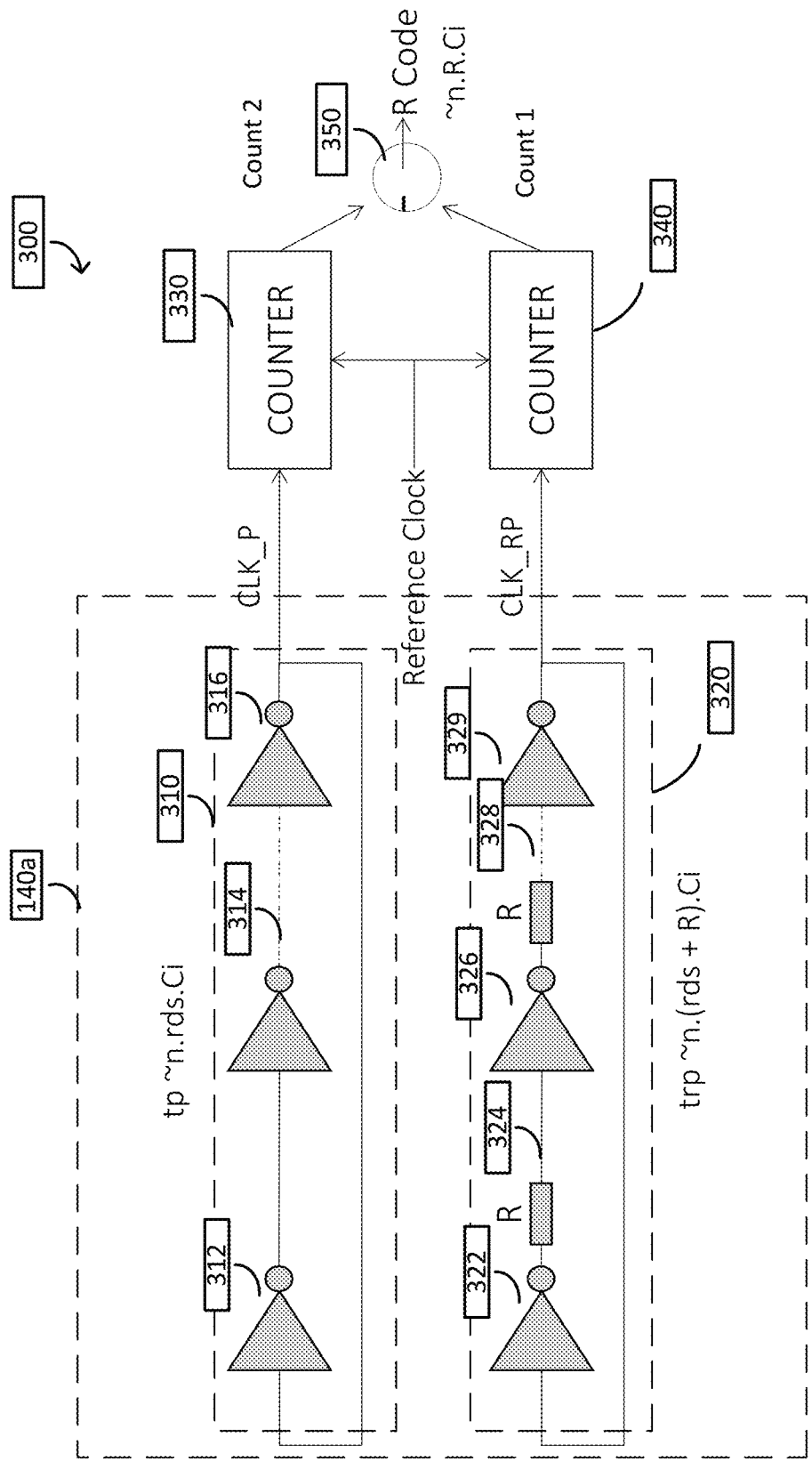
FIG. 3 shows an embodiment of a parameter monitor with two timing branches.

FIG. 3 shows an embodiment of a parameter monitor 300 that uses an oscillator circuit 140a with two separate oscillators—a first oscillator 310 without the circuit element to be measured and a second oscillator 320 including the circuit element to be measured. The parameter monitor 300 may include a first counter 330, a second counter 340 and a code generation circuit 350. The first oscillator 310 may have a N inverters in a ring oscillator configuration, where N is a positive odd integer greater than 1. The N inverters include at least a first inverter 312, a second inverter 314, and an Nth inverter 316. The resistance of the first oscillator 310 may be the equivalent resistance of the N inverters. The second oscillator 320 may also have N inverters including at least a first inverter 322, a second inverter 326 and an Nth inverter 329. The second oscillator also 320 includes a circuit element included in the first oscillator. In FIG. 3, the circuit element 120 has a resistance modeled as resistors 324 and 328. The resistances 324 and 328 may correspond to a resistance of the circuit element 120 (not shown). It should be appreciated that while resistors are shown in FIG. 3, any passive parameters may be used, such as capacitors or inductors, in any combination. The inclusion of the circuit element 120 in the second oscillator 320 causes the period of the second oscillator 320 to be longer than the period of the first oscillator 310. For example, if the second timing oscillator 320 has a resistance of rds and a capacitance of Ci like the first timing oscillator 310, then the inclusion of the resistance parameter R, being the value of the circuit element 120 in this example, will make the time constant of the second timing oscillator 320 (rds+R)*Ci. Counter 330 measures a characteristic time period of oscillator 310 as Count 1. Counter 430 measures a characteristic time period of oscillator 320 as Count 2. As discussed above, the code generation circuit 350 may include circuitry that generates a code by subtracting Count 1 and Count 2. Any suitable digital subtraction circuitry may be used.

In some embodiments, the parameter monitor may have only one oscillator. The monitored circuit element may be switched into or out of the oscillator by one or more switches. By using a single oscillator, the value of the circuit element may be measured more accurately by using the same inverters in both timing measurements, the effects of which are more reliably subtracted out.

Figure 4:
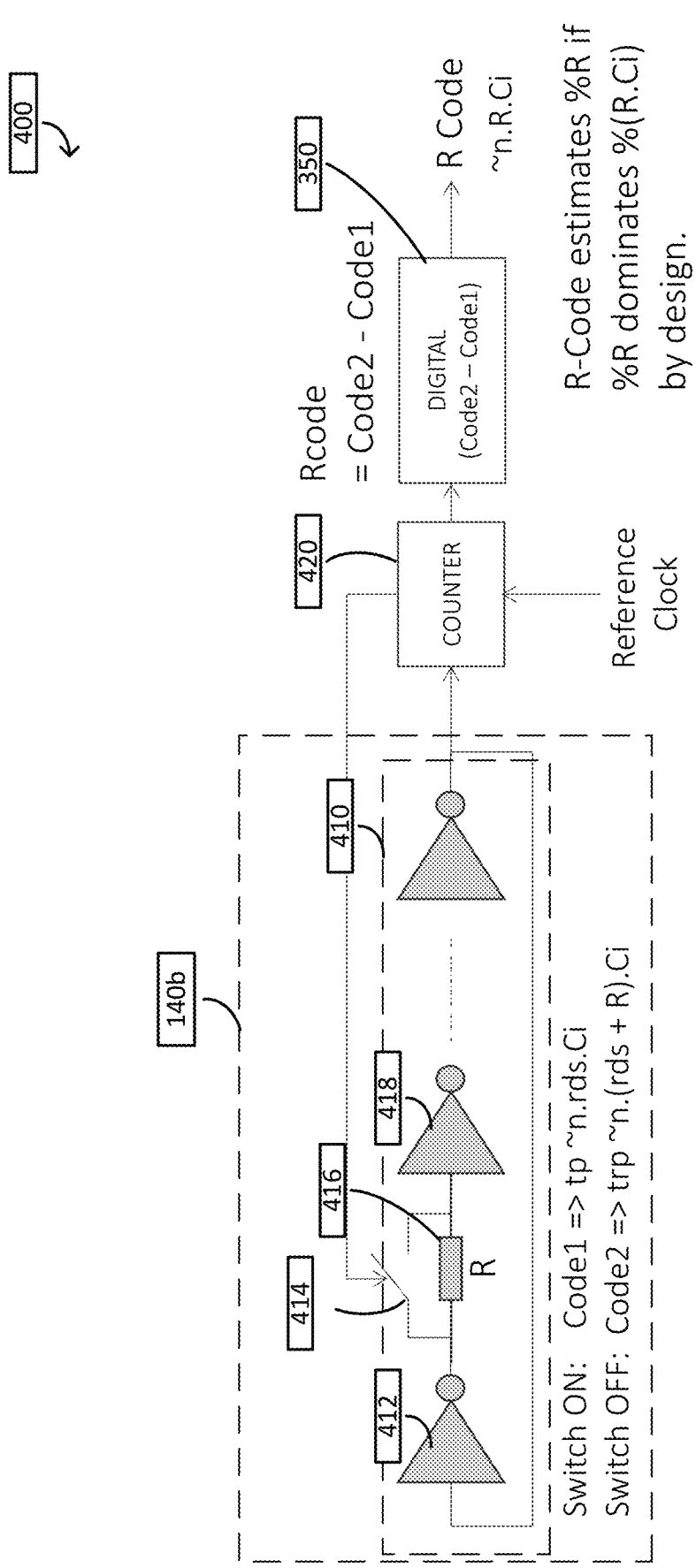
FIG. 4 shows an embodiment of a parameter monitor with one timing branch.

FIG. 4 shows another embodiment of a parameter monitor 400 that uses an oscillator circuit 140b with a single oscillator 410. The oscillator 410 may include N inverters including at least inverters 412, 418 and 419. The resistance of the measured circuit element is represented as a resistor R. A switch 414 allows shorting out the measured circuit element. When switch 414 is closed, the measured circuit element is shorted out, and does not affect the period of the oscillation of oscillator 410, as in oscillator 310 (FIG. 3). When switch 414 is open, the measured circuit element is connected and reduces the period of oscillation of the oscillator 410 due to the additional resistance. When switch 414 is open, oscillator 410 serves a function similar to that of oscillator 320 (FIG. 3). Control circuit 210 (FIG. 2A) may control switch 414 to be open or closed to make successive timing measurements of the oscillator 410 with and without the measured circuit element. The measurements may be performed in any suitable order. For example, in the method of FIG. 2B, act 242 may include controlling the switch 414 to be closed to remove the measured circuit element from the circuit, and counter 420 may measure a characteristic time period of the oscillation (Count 2). In act 244, the switch 414 may be opened to connect the measured circuit element into the circuit and counter 420 may measure a characteristic time period of the oscillation (Count 1). The counter 420 may save either or both of Count 1 and Count 2, and may provide them to code generation circuit 350. Alternatively, the order of acts 242 and 244 may be reversed.

Figure 5:
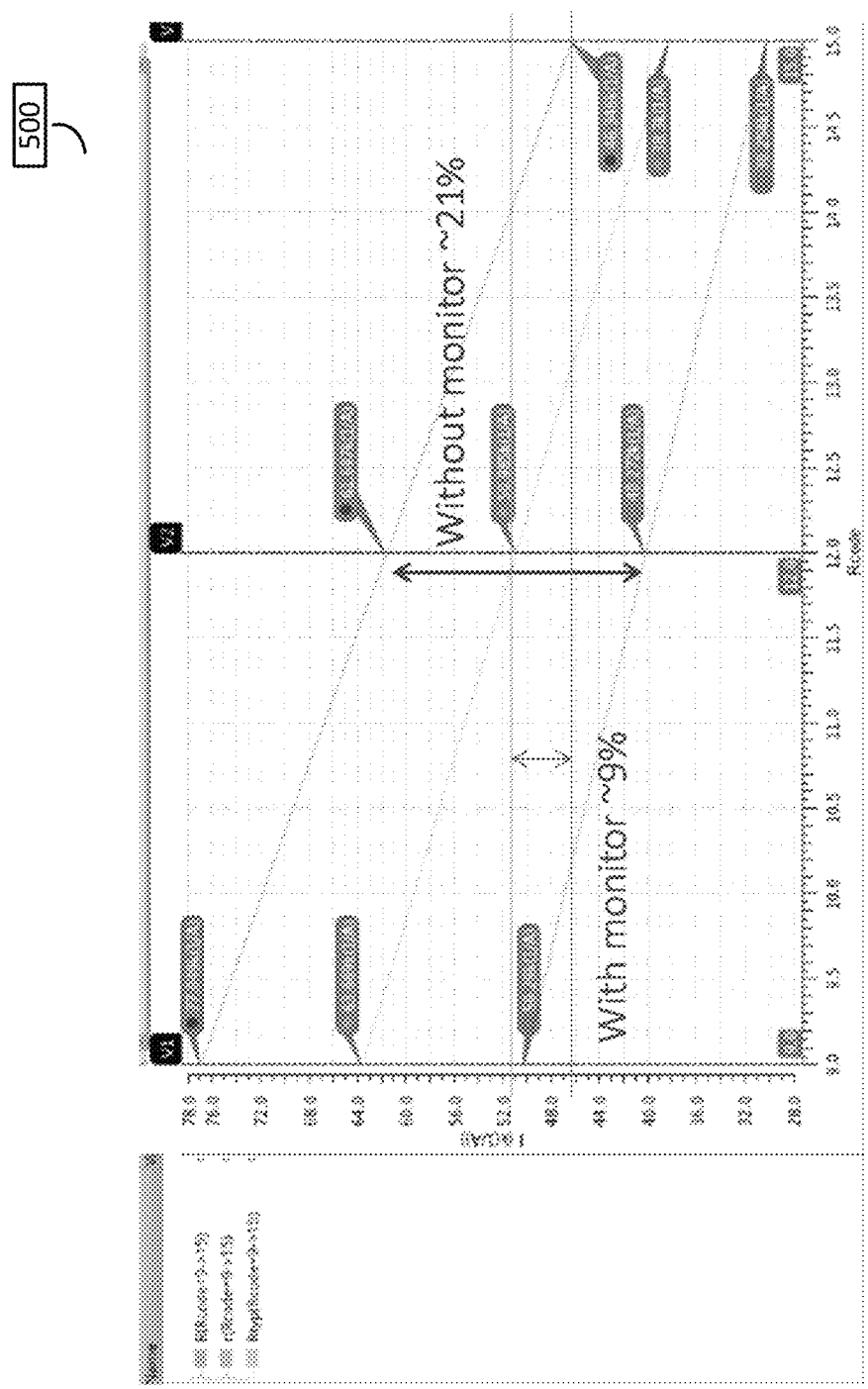
FIG. 5 shows an example of simulation results with and without a parameter monitor.

FIG. 5 shows an illustration 500 of a variation in parameter values with and without the parameter monitor according to one implementation. The illustration 500 represents the Rcode on the x-axis and the operating range on the y-axis. Simulation results show that without the parameter monitor, the parameter value has a 21% variation. With the inclusion of the parameter monitor and the corresponding adjustments to the value of the circuit element, the variation of the parameter value can be constrained to within 9%, which may represent a significant increase in accuracy of the system.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A parameter monitor for monitoring a parameter of a passive component on an integrated circuit, the parameter monitor comprising:
   an oscillator circuit;
   at least one counter configured to measure a first time period of an oscillation of the oscillator circuit with the passive component to produce a first digital count value and to measure a second time period of an oscillation of the oscillator circuit without the passive component to produce a second digital count value; and
   a code generation circuit configured generate a code indicative of a value of the passive component or a variation in the value of the passive component using the first and second digital count values.

2. The parameter monitor of claim 1, further comprising a control circuit configured to control the at least one counter.

3. The parameter monitor of claim 2, wherein the control circuit is configured to control the oscillator circuit.

4. The parameter monitor of claim 1, wherein the oscillator circuit comprises a first oscillator having the passive component and a second oscillator without the passive component.

5. The parameter monitor of claim 1, wherein the at least one counter comprises a counter configured to measure the first time period and the second time period, or the at least one counter comprises a first counter configured to measure the first time period and a second counter configured to measure the second time period.

6. The parameter monitor of claim 1, wherein the oscillator circuit comprises an oscillator and at least one switch configured to include or remove the passive component from the oscillator.

7. The parameter monitor of claim 1, wherein a value of the passive component is compensated based on the code.

8. The parameter monitor of claim 1, wherein a value of the passive component is compensated based on a difference between the code and a desired code value.

9. The parameter monitor of claim 1, wherein the passive component comprises a resistor, capacitor or inductor.

10. A parameter monitor for monitoring a parameter of a passive component on an integrated circuit, the parameter monitor comprising:

an oscillator circuit; and
circuitry configured to:
   measure a first time period of an oscillation of the oscillator circuit with a passive component to produce a first digital count value;
   measure a second time period of an oscillation of the oscillator circuit without the passive component to produce a second digital count value; and
   generate a code indicative of a value of the passive component or a variation in the value of the passive component using the first and second digital count values.

11. The parameter monitor of claim 10, wherein the oscillator circuit comprises a first oscillator having the passive component and a second oscillator without the passive component.

12. The parameter monitor of claim 10, wherein the oscillator circuit comprises an oscillator and at least one switch configured to include or remove the passive component from the oscillator.

13. The parameter monitor of claim 10, wherein a value of the passive component is compensated based on the code.

14. The parameter monitor of claim 13, wherein a value of the passive component is compensated based on a difference between the code and a desired code value.

15. A method for monitoring a parameter of a passive component on an integrated circuit, the method comprising:
   measuring a first time period of an oscillation of an oscillator circuit with a passive component to produce a first digital count value;
   measuring a second time period of an oscillation of the oscillator circuit without the passive component to produce a second digital count value; and
   generating a code indicative of a value of the passive component or a variation in the value of the passive component using the first and second digital count values.

16. The method of claim 15, further comprising compensating a value of the passive component based on the code.

17. The method of claim 16, wherein a value of the passive component is compensated based on a difference between the code and a desired code value.

18. The method of claim 15, wherein the code is generated by determining a difference between the first and second digital count values.

19. The method of claim 15, wherein the oscillator circuit comprises an oscillator and the method further comprises adding or removing the passive component from the oscillator.

20. The method of claim 15, wherein the first and second time periods are measured by counting clock pulses.

* * * * *